(12) United States Patent  
Campardo et al.

(10) Patent No.: US 9,069,015 B2  
(45) Date of Patent: Jun. 30, 2015

(54) INTERFACE BOARD OF A TESTING HEAD FOR A TEST EQUIPMENT OF ELECTRONIC DEVICES AND CORRESPONDING PROBE HEAD

(75) Inventors: Giovanni Campardo, Cernusco Lombardone (IT); Flavio Maggioni, Cernusco Lombardone (IT); Riccardo Liberini, Cernusco Lombardone (IT)

(73) Assignee: Technoprobe S.p.A., Cernusco Lombardone (IT)

( * ) Notice: Subject to any disclaimer, the term of this patent is extended or adjusted under 35 U.S.C. 154(b) by 191 days.

(21) Appl. No.: 13/548,004

(22) Filed: Jul. 12, 2012

(65) Prior Publication Data

US 2014/0015560 A1     Jan. 16, 2014

(51) Int. Cl.
*G01R 1/073*     (2006.01)

(52) U.S. Cl.
CPC ................................ *G01R 1/07378* (2013.01)

(58) Field of Classification Search
CPC ........................... G01R 1/073; G01R 1/07378
USPC ............. 324/754.03, 754.07, 754.08, 755.05, 324/755.07, 755.09, 755.11, 756.01, 324/756.03, 756.07, 762.01–762.06
See application file for complete search history.

(56) References Cited

U.S. PATENT DOCUMENTS

| | | | |
|---|---|---|---|
| 6,383,825 B1 * | 5/2002 | Farnworth et al. | 438/14 |
| 6,439,912 B1 * | 8/2002 | Andric et al. | 439/342 |
| 8,717,059 B2 * | 5/2014 | Kim | 324/762.01 |
| 2009/0108425 A1 * | 4/2009 | Lee et al. | 257/679 |
| 2009/0251123 A1 * | 10/2009 | Henson et al. | 323/311 |
| 2012/0280702 A1 * | 11/2012 | Lazzari | 324/750.25 |

* cited by examiner

*Primary Examiner* — Arleen M Vazquez  
*Assistant Examiner* — Robert P Alejnikov, Jr.  
(74) *Attorney, Agent, or Firm* — Seed IP Law Group PLLC

(57) ABSTRACT

An interface board of a testing head for a test equipment of electronic devices is described. The testing head includes a plurality of contact probes, each contact probe having at least one contact tip suitable to abut against contact pads of a device to be tested, as well as a contact element for the connection with a board of the test equipment. Suitably, the interface board comprises a substrate and at least one redirecting die housed on a first surface of that substrate and a plurality of contact pins projecting from a second surface of that substrate opposed to the first surface. The redirecting die includes at least one semiconductor substrate whereon at least a first plurality of contact pads is realized, suitable to contact a contact element of a contact probe of the testing head, the contact pins being suitable to contact the board.

16 Claims, 5 Drawing Sheets

INTERFACE BOARD OF A TESTING HEAD FOR A TEST EQUIPMENT OF ELECTRONIC DEVICES AND CORRESPONDING PROBE HEAD

FIELD OF APPLICATION

The present invention relates to an interface board of a testing head for a test equipment of electronic devices.

The invention relates particularly, but not exclusively, an interface board of a testing head for a test equipment of wafer-integrated electronic devices and the following description is made with reference to this field of application with the sole purpose of simplifying the explanation thereof.

PRIOR ART

As it is well known, a testing head is essentially a device suitable to electrically connect a plurality of contact pads of a microstructure, particularly a wafer-integrated electronic device, with corresponding channels of a test equipment performing the functionality check thereof, particularly the electrical one, or generically the test.

The test performed on integrated devices serves in particular to detect and isolate defective devices, already in the production step. Normally, testing heads are then used for the electrical test of wafer-integrated devices before cutting and mounting them within a chip containment package.

A testing or probe head essentially comprises a plurality of mobile contact elements or contact probes equipped with at least one contact portion or tip for a corresponding plurality of contact pads of a device to be tested. The terms end or tip indicate here and hereafter an end portion, being not necessarily pointed.

It is then known that the efficacy and the reliability of a testing test also depend, among other factors, on the realization of a good electrical connection between the device and the test equipment, then, on an optimum probe/pad electrical contact.

Among the typologies of testing heads used in the technical field being here considered for testing integrated circuits, the so-called testing head with cantilever probes, also called cantilever testing heads are widely used, which just have probes projecting like a fishing rod over a device to be tested.

In particular, a cantilever testing head of the known type normally supports a plurality of probes, which are flexible, generally in the form of a wire, with predetermined electrical and mechanical properties. The probes, cantilevering from the cantilever testing head, have a substantially hooked shape, due to the presence of a substantially elbow-bent end section having a generally obtuse inner angle.

The good connection between the probes of a cantilever testing head and the contact pads of a device to be tested is ensured by pressing the testing head on the device itself, the probes undergoing on this occasion a vertical flexure (with respect to the plane defined by the device to be tested) in an opposite sense to the movement of the device towards the testing head.

The probe hooked shape is such that, during the contact with the contact pads of the device to be tested and the probe travel upwards beyond a predetermined contact point, commonly called "overtravel", the probe contact tips slide on the contact pads for a length commonly called "scrub".

This technique, although advantageous when adopted for the application to integrated circuits of the type conventionally used until not long ago, proves unsuitable for the testing of late-design integrated circuits, having problems linked to an intrinsic limitation in the probe density and in the parallelism thereof.

In order to overcome these drawbacks, it is known to use testing heads called vertical probe head. A vertical probe head essentially comprises a plurality of contact probes held by at least one pair of plates or guides being substantially plate-like and parallel to each other. These guides are equipped with suitable holes and positioned at a certain distance from each other so as to leave a free area or an air gap for the movement and possible deformation of contact probes. The pair of guides comprises in particular an upper guide and a lower guide, both provided with guide holes in which the contact probes axially slide, normally formed by wires of special alloys with good electrical and mechanical properties.

The good connection between the testing probes and the contact pads of the device being tested is, in that case too, ensured by pressing the testing head on the device itself, the contact probes, mobile in the guide holes realized in the upper and lower guides, undergoing, during such a pressing contact, a flexure inside the air gap between the two guides and a sliding inside such guide holes.

Moreover the flexure of contact probes in the air gap can be helped through an appropriate configuration of the probes themselves or of their guides, particularly using pre-deformed contact probes or appropriately shifting the plates comprising them.

FIG. 1 schematically shows a testing head 1 comprising at least one upper plate or guide 2 and one lower plate or guide 3, having respective upper 2A and lower 3A guide holes, in which at least one contact probe 4 slides.

The contact probe 4 has at least one contact end or tip 4A. In particular the contact tip 4A abuts against a contact pad 5A of a device 5 to be tested, making the mechanical and electrical contact between said device and a test equipment (not represented), of which such a testing head forms a terminal element.

In general, testing heads are used, that have probes not being fixedly constrained, but held interfaced with a board, connected in turn to the test equipment: these are testing heads with unlocked probes.

In this case, as shown in FIG. 1, the contact probe 4 has a further contact tip 4B, usually indicated as contact head, towards a plurality of contact pads 6A of the board 6. The good electrical contact between the probes and the board is ensured similarly to the contact with the device to be tested by pressing the probes on the contact pads of the board.

Furthermore, the board 6 is kept in position by means of a stiffener. The combination of the testing head, of the board and of the stiffener forms a terminal portion of the test equipment, globally indicated with 10 in FIG. 2.

In the vertical probe technology, it is then important to ensure also the good connection of the contact probes with the test equipment, in particular in correspondence with the contact heads thereof and then with the board.

Another critical parameter in realizing a testing head is the distance (the so-called pitch) between the centers of the contact pads on the device to be tested. The pitch of integrated electronic devices, with the development of the corresponding manufacturing technologies, has become smaller and smaller, forcing to a high packing of contact probes 4 in the testing head 1, with the related positioning problems so as to avoid the reciprocal contact. These distance constraints are instead slightly less binding for the contact pads on the board 6, these pads being allowed to be more spaced and arranged in a more free way, in particular more regularly, if compared to those of the device to be tested.

Several technologies for realizing the board 6 associated to the testing head 1 in the terminal portion 10 of the test equipment are known.

In particular, a first solution uses the printed circuit techniques to realize the board 6, which is also commonly indicated as PCB. This technology allows boards with also-big-sized active areas to be realized, but with great limitations in comparison with a minimum reachable value for the pitch in high density conditions of the contact pads on the device to be tested.

The ceramic-based technology or MLC, acronym of the English "Multilayer Ceramic" is also known. Such a technology allows very low pitches to be obtained and higher densities in comparison with the PCB technology, but it inserts limitations on the highest number of signals which can be used for the testing and on the biggest size of the active area which can be housed on the board.

Finally, it is possible to use a so-called hybrid technology in which the testing head is interfaced with an intermediate board, commonly indicated with interposer, connected in turn to a mechanical support, commonly indicated with plug and connected through welding bridges to the board. This technology offers a great flexibility in terms of surface, pitch and density of signals, but it turns out to be limited in the highest number of processable signals, also having worse electromagnetic performances. A not least disadvantage of the hybrid technology is the difficult automation thereof.

The technical problem of the present invention is to provide a board for a testing head equipped with a plurality of contact probes for the connection with a test equipment of electronic devices, in particular wafer-integrated, having such structural and functional features as to allow the limitations and drawbacks still afflicting the boards realized with known technologies to be overcome, in particular allowing the testing of devices with a high density of contact pads to be handled.

SUMMARY OF THE INVENTION

The solution idea underlying the present invention is to associate to the board of a testing head for the connection with the test equipment an interface board which is realized using the photolithographic techniques commonly used to realize the integrated devices to be tested.

Based on this solution idea the technical problem is solved by an interface board of a testing head for a test equipment of electronic devices, such a testing head comprising a plurality of contact probes, each contact probe having at least one contact tip suitable to abut against contact pads of a device to be tested, as well as a contact element for the connection with a board of the test equipment, characterized in that it comprises a substrate and at least one redirecting die housed on a first surface of the substrate and a plurality of contact pins projecting from a second surface of the substrate opposed to the first surface, the redirecting die comprising at least one semiconductor substrate whereon at least a first plurality of contact pads is realized being suitable to contact a contact element of a contact probe of the testing head, the contact pins being suitable to contact the board.

More particularly, the invention comprises the following additional and optional features, taken individually or in case in combination.

According to an aspect of the invention, the contact pads of the first plurality may be distributed in a first central portion of the redirecting die with a spatial distribution substantially corresponding to a spatial distribution of a plurality of contact pads of the device to be tested.

According to another aspect of the invention, the board may further comprise a second plurality of contact pads distributed in a second peripheral portion of the redirecting die and connected to the contact pads of the first plurality by means of a plurality of metallic interconnection tracks realized in the substrate of the redirecting die, the second peripheral portion surrounding the first central portion.

In particular, according to an aspect of the invention, the first central portion may have a substantially rectangular shape and the second peripheral portion may have a substantially rectangular ring-like shape around the first central portion.

According to an aspect of the invention, the board may further comprise a plurality of metallic pads realized on a peripheral portion of the substrate of the interface board left free from the redirecting die and connected to the contact pins.

According to such an aspect of the invention, the board may also comprise a plurality of bonding wires suitable to connect the metallic pads with the contact pads of the second plurality.

According to another aspect of the invention, the redirecting die may comprise a package of the PGA type being free of lid.

Moreover, according to another aspect of the invention, the redirecting die may comprise wire bonding connections of direct connection between the second plurality of contact pads and contact pads arranged in the board of the test equipment.

Furthermore, according to yet another aspect of the invention, the redirecting die may comprise connections of the TSV type between the two surfaces thereof in correspondence with the contact pads of the second plurality.

According to an aspect of the invention, the redirecting die may also comprise additional electrical components realized in the substrate thereof.

Moreover, according to an aspect of the invention, the redirecting die may comprise a logic testing portion regulating the connection between its pads and the contact probes.

According to another aspect of the invention, the redirecting die may have a size being substantially equal to a wafer comprising a plurality of devices to be tested.

Furthermore, according to an aspect of the invention, the interface board may comprise at least one parallel testing module including in turn a plurality of redirecting dice arranged as a matrix and appropriately spaced from each other by means of separation passages.

According to this aspect of the invention, the parallel testing module may also comprise a plurality of slots realized in the separation passages and suitable to cross a substrate of the parallel testing module so as to house bonding wires for the connection with the metallic pads realized on the substrate of the interface board in correspondence with the slots.

The technical problem is also solved by a testing head for a test equipment of electronic devices of the type comprising a plurality of contact probes, each contact probe having at least one contact tip suitable to abut against contact pads of a device to be tested, as well as a contact element for the connection with a board of the test equipment, characterized in that it comprises at least one interface board as above described.

Finally, the technical problem is solved by a method for realizing an interface board of a testing head for a test equipment of electronic devices, the testing head comprising a plurality of contact probes, each contact probe having at least one contact tip suitable to abut against contact pads of a device to be tested, as well as a contact element for the connection with a board of the test equipment, the method comprising the steps of:
- providing a substrate for the interface board realized with the printed circuit techniques;
- integrating a redirecting die on a semiconductor substrate using the integration techniques of the integrated circuits;
- housing the redirecting die on a first surface of the substrate of the interface board; and
- electrically connecting a plurality of contact pads of the redirecting die with a plurality of contact pins projecting from a second surface of the substrate opposed to the first surface whereon the redirecting die is housed, the contact pins being suitable to contact corresponding contact pads of a board for realizing the desired connection with the test equipment.

According to an aspect of the invention, the step of integrating the redirecting die on the semiconductor substrate may comprise the steps of:
- realizing a first plurality of contact pads distributed in a first central portion of the redirecting die;
- realizing a second plurality of contact pads distributed in a second peripheral portion of the redirecting die, the second peripheral portion having a ring-like shape around the first central portion; and
- realizing a plurality of metallic interconnection tracks, suitable to connect the contact pads of the first central portion with the contact pads of the second peripheral portion of the redirecting die.

According to another aspect of the invention, the step of realizing the first plurality of contact pads distributed in the first central portion of the redirecting die may comprise a step of positioning the contact pads in a spatial way corresponding to a plurality of contact pads realized on a device to be tested.

Moreover, according to another aspect of the invention, the step of integrating the redirecting die on the semiconductor substrate may comprise the steps of back end masking used in the integration techniques of the integrated circuits for realizing the contacts and the connections.

According to an aspect of the invention, the steps of back end masking use the masks of the metallizations, contacts and vias and of the passivation.

According to an aspect of the invention, the method may further comprise the steps of:
- realizing a plurality of metallic pads on the substrate of the interface board, into electrical connection with the contact pins; and
- connecting the metallic pads to the contact pads of the second peripheral portion of the redirecting die by means of bonding wires.

According to another aspect of the invention, the method may further comprise a step of connecting the contact pads of the second peripheral portion of the redirecting die to the contact pads of the board of the test equipment.

According to an aspect of the invention, the method may further comprise a step of positioning the redirecting die in a centered way in comparison with the substrate of the interface board before performing the step of housing the redirecting die on a first surface of the substrate.

According to another aspect of the invention, the step of housing the redirecting die on a first surface of the substrate of the interface board may comprise a step among the following:
- gluing the redirecting die on the first surface of the substrate; and
- welding the redirecting die on the first surface of the substrate.

Moreover, according to an aspect of the invention, the step of housing the redirecting die on a first surface of the substrate may preventively comprise a step of associating the redirecting die to an intermediate base.

According to another aspect of the invention, the method may comprise a step of realizing connections of the TSV type in the redirecting die so as to contact the two surfaces thereof, these connections of the TSV type being realized in correspondence with the contact pads of the second peripheral portion of the redirecting die.

According to yet another aspect of the invention, the step of integrating the redirecting die on the semiconductor substrate may comprise a step of encapsulating the redirecting die in a package of the PGA type, being appropriately free of lid.

Finally, according to an aspect of the invention, the method may further comprise a step of integrating additional electrical components and/or a portion of a testing logic in the semiconductor substrate of the redirecting die.

The features and advantages of the interface board, of the testing head and of the method according to the invention will be apparent from the following description of an embodiment thereof given by way of not limiting example with reference to the attached drawings.

DETAILED DESCRIPTION

Figure 1:
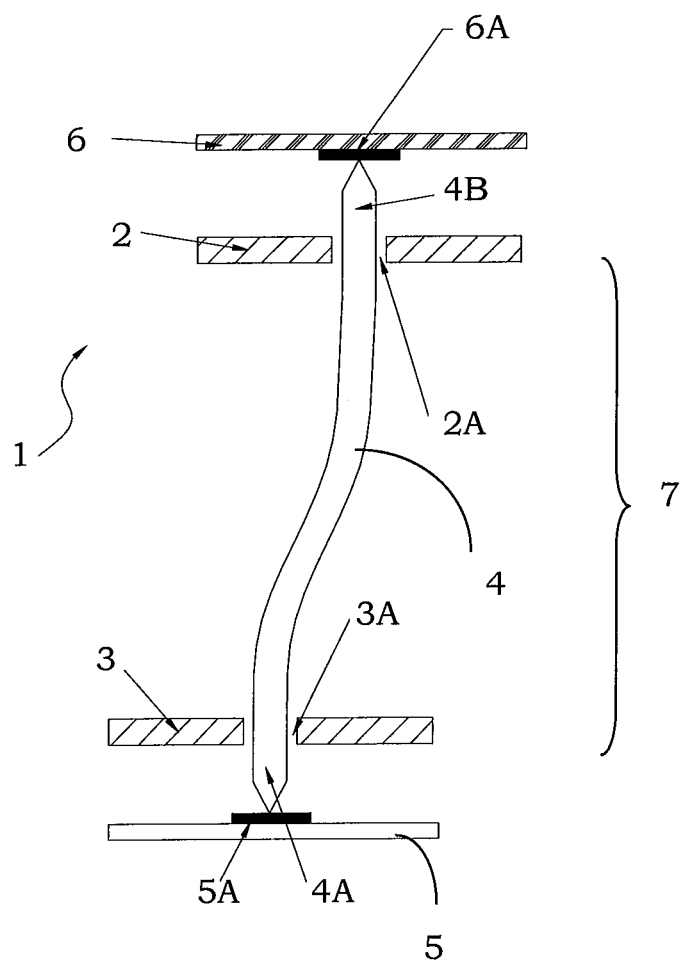
FIG. 1 schematically shows a contact probe for a vertical probe head realized according to the prior art.
Figure 2:
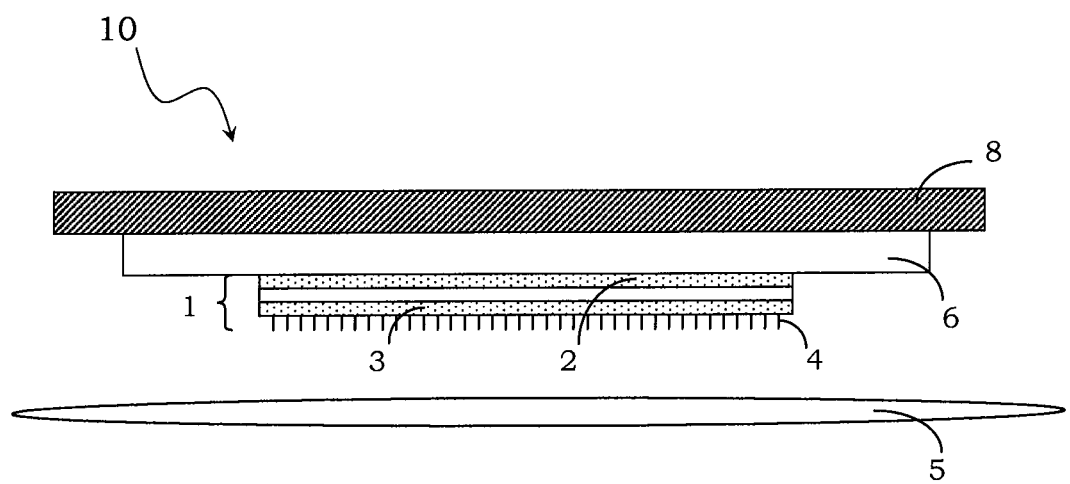
FIG. 2 schematically shows a terminal portion of a test equipment comprising a vertical probe head realized according to the prior art.
Figure 3:
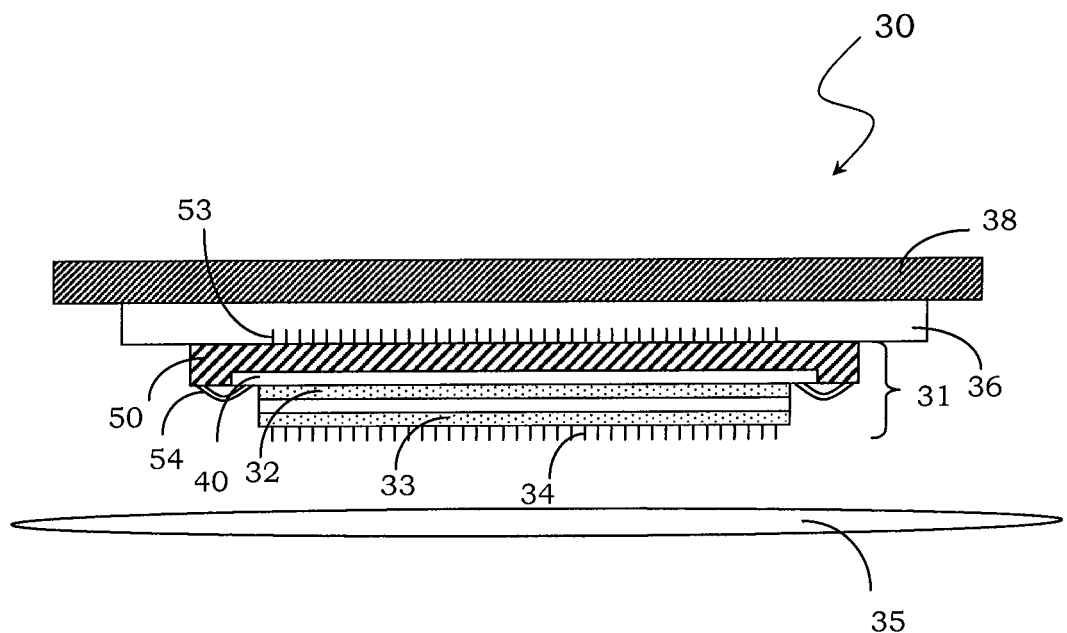
FIG. 3 schematically shows a terminal portion of a test equipment comprising an interface board according to an embodiment of the invention.

With reference to these figures, and in particular to FIG. 3, a terminal portion of a test equipment comprising a testing head equipped with a plurality of contact probes for the testing of electronic devices, in particular wafer-integrated devices, is globally indicated with 30. Hereafter, for simplicity this terminal portion of the test equipment (not represented) will be indicated as test block 30.

It should be noted that the figures are schematic views of the system according to the invention and they are not drawn in scale, but they are instead drawn so as to emphasize the important features of the invention.

Moreover, the different aspects of the invention represented by way of example in the figures can be obviously combined with each other and interchanged from an embodiment to another.

The test block 30 essentially comprises a testing head 31 in which a plurality of contact probes 34 are housed, as well as a board 36, associated to a stiffener 38 and suitable to connect with a test equipment (not shown). In particular, the testing head 31 comprises at least one upper plate or guide 32 and one lower plate or guide 33, having respective holes in which the contact probes 34 slide.

As already explained with reference to the prior art, each contact probe 34 has at least one contact end or tip suitable to abut against contact pads of a device 35 to be tested, as well as a further contact end or head for the connection with the test equipment (not represented) by means of the board 36, as it will be explained hereafter.

In alternative, the contact probes 34 can be removably associated to a support, for example a ceramic one, equipped with corresponding contact elements with the board 36, for example bumps projecting from the support. In particular, the contact probes 34 can be welded to the support, thus realizing a constrained-probe testing head 31.

However, also in that case, we will talk about a contact element of the corresponding contact probe 34 for the connection with the board 36.

According to an aspect of the invention, the testing head 31 further comprises an interface board 50 interposed between the upper guide 32 and the board 36. More particularly, the interface board 50 comprises a redirecting die 40 whereon the contact elements of the contact probes 34 of the testing head 31 abut and equipped with a plurality of contact pins 53 for the board 36.

Figure 4:
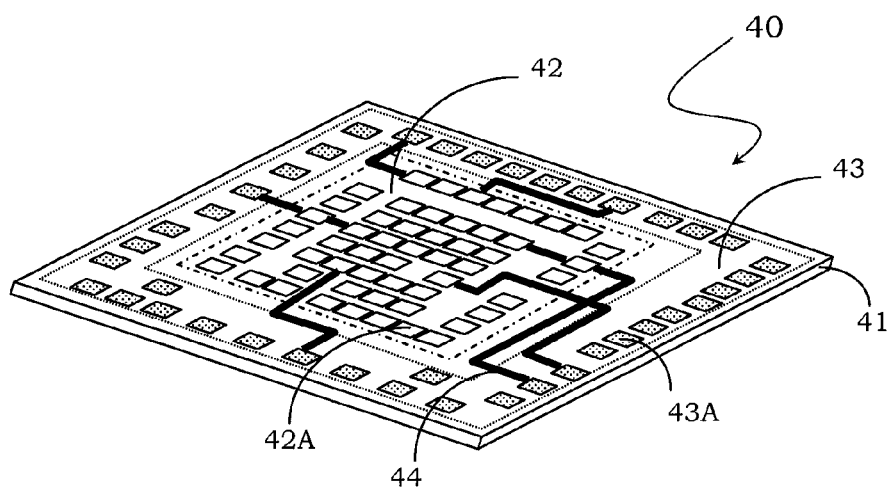
FIG. 4 schematically shows a redirecting die of an interface board according to an embodiment of the invention.

The redirecting die 40 is shown in greater detail in FIG. 4. It comprises a substrate 41 of substantially rectangular shape and a plurality of contact pads distributed on the substrate 41.

More particularly, the contact pads of the redirecting die 40 comprise a first plurality of contact pads 42A distributed in a first central portion 42 of substantially rectangular shape of the redirecting die 40 and a second plurality of contact pads 43A distributed in a second peripheral portion 43 of the redirecting die 40, the second peripheral portion 43 having a rectangular ring-like shape around the first central portion 42. Obviously, different distributions of the second plurality of contact pads 43A are possible in comparison with what illustrated in FIG. 4 by simple way of example. It is possible for example to distribute that second plurality of contact pads 43A in a generally "staggered" way.

According to an aspect of the invention, the substrate 41 is a semiconductor substrate and the contact pads of the first plurality and of the second plurality, 42A and 43A, are realized therein using the lithographic technology of semiconductor integrated circuits.

In fact, the present invention arises from the consideration that the fundamental problem connected to realizing a testing block 30 comprising a board, be it in the PCB technology or in ceramic, is linked to the dimensional constraints of the device to be tested, which is realized with technologies of the photolithographic type, compared with those of the technologies used for realizing the board for the test equipment. In particular, the greatest difficulties are linked to passing from connections having contact pads with a certain pitch, being the distance between the centers of the pads themselves, to connections with pads which are realized in another technology and should have an acceptable pitch so as to avoid the contact problems between probes and ensure the correct contact between the device to be tested and the test equipment.

It is also known that the progress in the lithographic technologies allowing the integrated circuits to be realized makes the spatial transformation from the distances between the contact pads of the devices to be tested toward those between the contact pads of the board of the test equipment more and more difficult. In known solutions, this transformation is obtained at the cost of the insertion of different elements, with different features constituting a spatial 'decoding' able to put the connections of the device to be tested, in particular the contact pads thereof, in communication with the connectors reaching the test equipment, in particular the contact probes.

The present invention arises then from the acknowledgement of the fact that the most critical point, in this spatial decoding chain, is the portion receiving the contact of the contact elements of the probes included in the testing head and contacting on the side of their tips the contact pads of the device to be tested, while with their contact elements they contact the board towards the side of the test equipment.

According to an aspect of the invention, the contact pads 42A of the first central portion 42 are distributed in a way corresponding to the contact pads of the device 35 to be tested, while the contact pads 43A of the second peripheral portion 43 are distributed along the edges of the redirecting die 40. Appropriately, the contact pads 43A of the second peripheral portion 43 can be realized with a suitable pitch and size to easily couple with the board 36, not being, as it will be apparent from the rest of the description, constrained from the distribution of the contact pads of the device to be tested.

Moreover, the redirecting die 40 comprises a plurality of metallic interconnection tracks 44, suitable to connect the contact pads 42A of the first central portion 42 with the contact pads 43A of the second peripheral portion 43.

In particular, the contact pads 42A of the first central portion 42 are contacted by the contact elements of the contact probes 34 while the contact pads 43A of the second peripheral portion 43 are suitable to connect with the board 36 and then with the test equipment.

Figure 5:
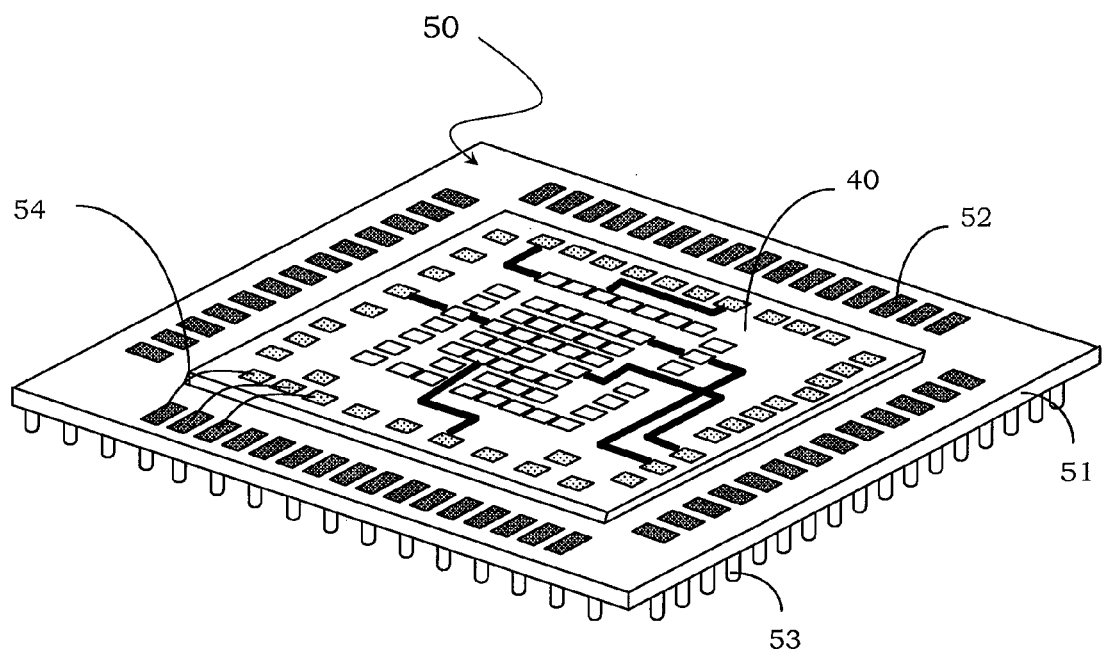
FIG. 5 schematically shows an interface board according to an embodiment of the invention.

In greater detail, as shown in FIG. 5, the redirecting die 40 is included in an interface board 50, in turn in contact with the board 36. The interface board 50 comprises a substrate 51, realized in particular with the PCB technology and comprising a plurality of metallic pads 52 connected by means of bonding wires 54 to the contact pads 43A of the second peripheral portion 43 of the redirecting die 40. The plurality of metallic pads 52 of the interface board 50 is then connected to a plurality of contact pins 53, projecting from a surface of the substrate 51 opposed a that whereon the redirecting die 40 is housed and suitable to contact corresponding contact pads of the board 36 for realizing the desired connection with the test equipment.

In particular, the interface board 50 is realized removably associating the redirecting die 40 on a surface of the substrate 51, appropriately in a central position, the substrate 51 having a larger size than the redirecting die 40 so that the redirecting die 40, once positioned, leaves a peripheral crown of the substrate 51 free whereon it is possible to realize the pads 52 and to perform the bonding with the contact pads 43A of the second peripheral portion 43 of the redirecting die 40.

In a first embodiment of the invention, the redirecting die 40 is realized in the form of a package of the PGA (Pin Grid Array) type and is associated to the substrate 51 of the interface board 50, for example by gluing or welding, using in case an intermediate base (not shown) between the redirecting die 40 and the substrate 51.

In that case, differently from the known packages of the PGA type, the containment package of the redirecting die 40 is not sealed with a lid so as to allow the contact elements of the contact probes 34 of the testing head 31 to contact the contact pads 42A of the first central portion 42 of the redirecting die 40.

It is suitable to note that for realizing the redirecting die 40 it is not necessary to use a complete flow of an integration process of a semiconductor device. In fact it is enough to provide the substrate 41 and use the final masks, the so-called back end masks, which, in the semiconductor device integration processes, are used to realize the contacts and the connections. It is then possible to realize the redirecting die 40 without implementing the most recent integration technologies, reducing the realization costs of that redirecting die 40. More particularly, for realizing the redirecting die 40, only the back end masks are used, i.e. the masks of the metallizations, contacts and vias and finally of the passivation so as to open the areas in which the contact probes 34 will abut.

In a second embodiment, the redirecting die 40 is fastened directly to the interface board 50, realizing the connections of wire bonding directly between the second plurality of contact pads 43A of the redirecting die 40 and the contact pads arranged in the board 36 and saving any intermediate connection, in particular bonding wires.

In a third embodiment, connections of the TSV (Through Silicon Vias) type are realized on the redirecting die 40, so as to put into contact the two surfaces of the redirecting die 40 itself. In particular, it is possible to realize these TSV connections by means of through holes, appropriately metalized and positioned accordingly. It is thus possible to eliminate bonding wires and directly connect, for example through a bumping process, the contact pads 43A of the second peripheral portion 43 of the redirecting die 40, connected by means of the metallic interconnection tracks 44 to the contact pads 42A of the first central portion 42 whereon the contact elements of the contact probes 34 of the testing head 31 abut, with the back side of the redirecting die 40 and directly with the board 36.

It should be noted that, according to this embodiment, it is possible to obtain a better connection from the electrical point of view since the paths of the metallic interconnection tracks 44 are reduced and the bonding wires 54 are eliminated, with a simplification of the whole testing block 30. In this case, the redirecting die 40 is mounted directly on the board 36.

According to an alternative embodiment, additional electrical components are realized on the redirecting die 40, comprising active or passive components, in particular inductors, capacitors and resistors, obtained by using the conventional layers provided by the lithographic technique through which the redirecting die 40 is realized.

According to a further alternative embodiment, also a testing logic portion is integrated on the redirecting die 40, allowing the contact probes 34 to be connected in a simpler way to the device 35 to be tested with the test equipment.

Still according to another alternative embodiment, the redirecting die 40 is realized with a size similar to a silicon wafer which comprises a plurality of devices to be tested. It is thus possible to perform the parallel testing of all the devices integrated on an entire wafer with a single test touch down of the testing block 30 comprising such a redirecting die 40, which reproduces the "image" of all the devices integrated on the wafer.

Figure 6:
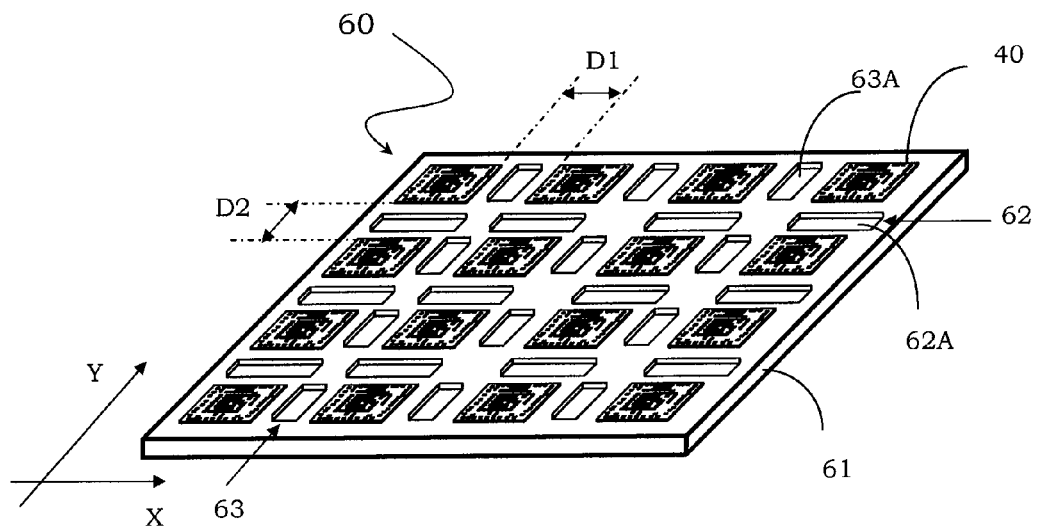
FIG. 6 schematically shows a parallel testing module of an interface board according to a further embodiment of the invention.

It is also possible to perform the parallel testing of a plurality of devices realizing a parallel testing module 60 comprising a plurality of redirecting dice 40, as schematically illustrated in FIG. 6.

The parallel testing module 60 comprises a substrate 61 whereon a plurality of redirecting dice 40 is realized, as above described. In particular, each redirecting die 40 comprises a first plurality of contact pads distributed in a central portion thereof and a second plurality of contact pads distributed in a peripheral portion thereof, the single redirecting die 40, and in particular the central portion thereof having pads arranged in a way corresponding to the contact pads of the device to be tested, in a substantially "mirrored" manner.

According to an aspect of the invention, the redirecting dice 40 are arranged on the substrate 61 so as to be appropriately spaced according to the development directions of that substrate 61, in particular a transverse development direction and a longitudinal development direction, indicated as X and Y in FIG. 6.

As shown in that figure, two adjacent redirecting dice 40 according to the transverse development direction X are spaced by a first distance D1 and two adjacent redirecting dice 40 according to the longitudinal development direction Y are spaced by a second distance D2. In other words, the redirecting dice 40 are arranged substantially as a matrix, a plurality of first separation passages 62 being defined according to the transverse development direction X and a plurality of second separation passages 63 being defined according to the longitudinal development direction Y.

According to an aspect of the invention, respective first slots 62A are realized in the first separation passages 62 in correspondence with the redirecting dice 40 and having at least one dimension, in particular a length, substantially equal to that of the redirecting dice 40 which are adjacent thereto. In that way, pairs of side-by-side redirecting dice 40 along the transverse development direction X are spaced from a first slot 62A having a length substantially equal to the dimension of the redirecting dice 40 along the transverse development direction X.

Similarly, respective second slots 63A are realized in the first separation passages 62 in correspondence with the redirecting dice 40 and having at least one dimension, in particular a length, substantially equal to that of the redirecting dice 40 which are adjacent thereto. In that way, pairs of side-by-side redirecting dice 40 along the longitudinal development direction Y are separate from a second slot 63A having a length substantially equal to the dimension of the redirecting dice 40 along the longitudinal development direction Y.

In substance, the parallel testing module 60 includes a plurality of redirecting dice 40 arranged as a matrix and appropriately spaced from each other by means of separation passages 62 and 63.

The parallel testing module 60 is removably associated with the substrate 51 of the interface board 50, which is thus suitable for performing the parallel testing of a plurality of devices.

As above described, on the substrate 51 of the interface board 50 a plurality of metallic pads connected by means of bonding wires 54 with the contact pads of the peripheral portion of the redirecting dice 40 is realized. According to an aspect of the invention, metallic pads are also realized in correspondence with the first and second slots 62A and 63A.

It is thus possible to connect all the contact pads of the peripheral portions of all the redirecting dice 40 included in the parallel testing module 60 to corresponding metallic pads of the interface board 50 without using bonding wires which are particularly long or which should be let pass over the other bonding wires. On the contrary, thanks to the presence of the first slot 62A and of the second slot 63A in the parallel testing module 60, it is possible to use, for the connection of the redirecting dice 40 which are present therein, the bonding wires 54 of a same length, in particular for all the connections between the contact pads of the peripheral portion of each redirecting die 40 and the metallic pads realized on the substrate 51 of the interface board 50.

The plurality of metallic pads of the interface board 50 can be then connected to a plurality of contact pins, projecting from a surface of the substrate 51 opposed to that whereon the redirecting die 40 is housed and suitable to contact corresponding contact pads of the board 36 for realizing the desired connection with the test equipment, as above described.

Figure 7:
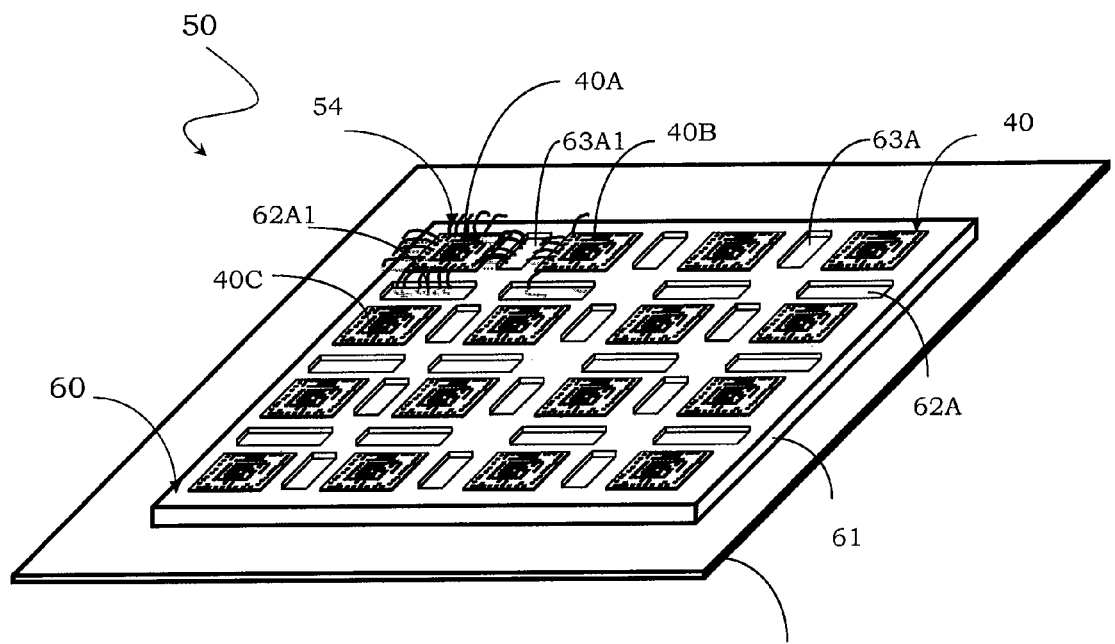
FIG. 7 schematically shows an interface board according to a further embodiment of the invention.

In greater detail, in FIG. 7, it is underlined how a redirecting die, for example the first die 40A, of the parallel testing module 60 is flanked, along the transverse development direction X, by a first slot 62A1 which spaces it from a second die 40B which is adjacent thereto along that transverse development direction X and is flanked, along the longitudinal development direction Y, by a second slot 63A2 which spaces it from a third die 40C which is adjacent thereto along that longitudinal development direction Y.

Furthermore, the first die 40A comprises a plurality of bonding wires 54 connected to the contact pads of the peripheral portion thereof, in correspondence with the four sides thereof. According to an aspect of the invention, at least a first plurality of bonding wires 54 is realized so as to slip into the first slot 62A1 and at least a second plurality of bonding wires 54 is realized so as to slip into the second slot 63A1. Suitably, metallic pads of the interface board 50 are realized on its substrate 51 in correspondence with that first slot 62A1 and second slot 63A1 and suitably connected, by means of the bonding wires 54, to the contact pads of the peripheral portion of the first die 40A.

In substance, the parallel testing module 60 comprises a plurality of slots, the first slots 62A and the second slots 63A, realized in the separation passages 62 and 63 of the redirecting dice 40, these slots being realized so as to cross a substrate 61 in order to be able to house the bonding wires 54 for the connection with metallic pads realized on the substrate 51 of the interface board 50 just in correspondence with the slots.

It is then evident that the configuration of the parallel testing module 60, thanks to the presence of the first slots 62A and of the second slots 63A, can be realized with a wire bonding process similar to the one used for a single redirecting die 40 of the type shown in FIGS. 4 and 5. Moreover, in such a wire bonding process, bonding wires 54 of a same length are used for the connections on all the four sides of each redirecting die 40.

Figure 8:
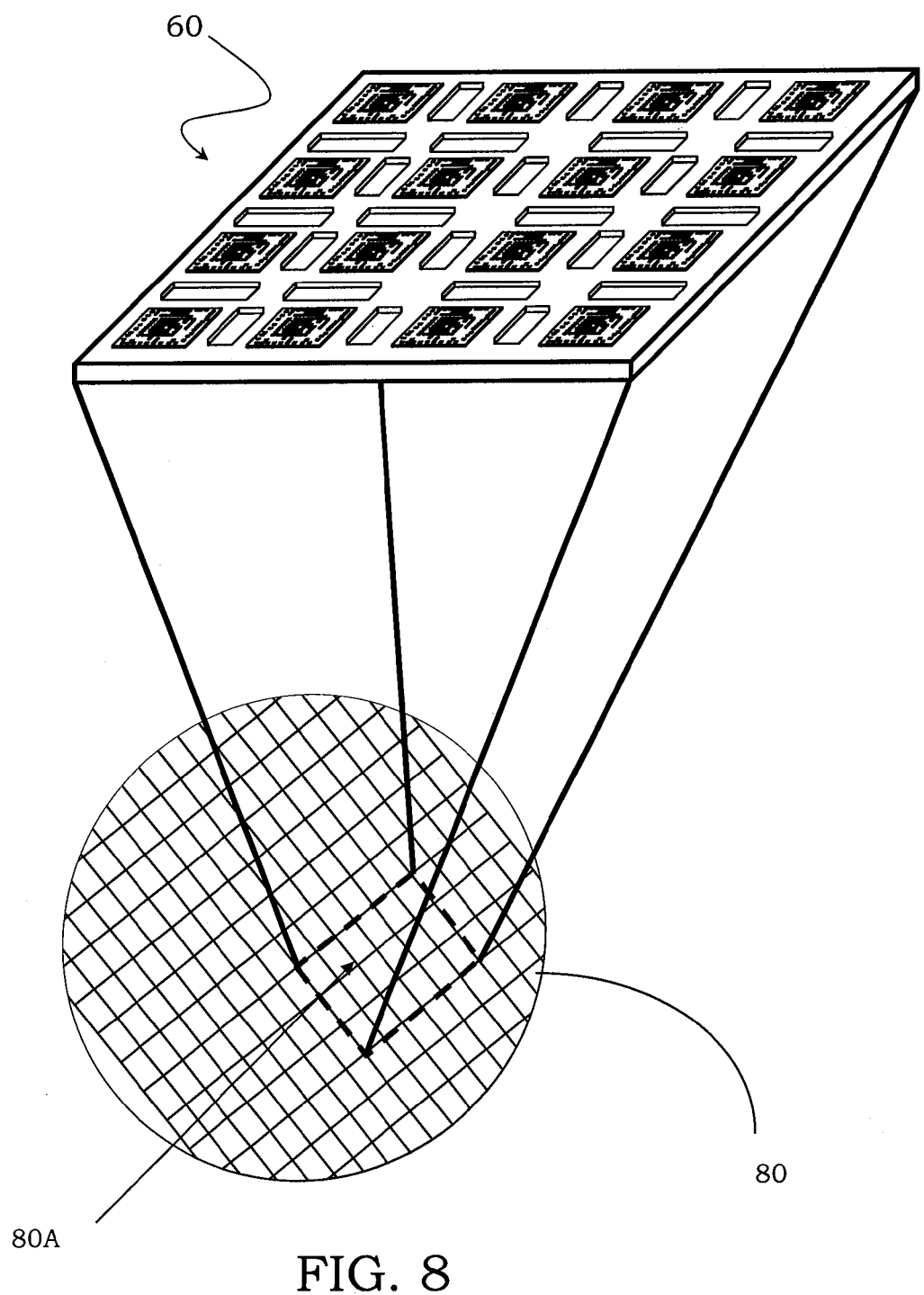
FIG. 8 schematically shows a semiconductor wafer comprising at least one parallel testing module of FIG. 6.

It should be underlined that a parallel testing module 60 can be drawn by means of an appropriate partition of a silicon wafer in which a plurality of redirecting dice 40 has been distributed. In particular, as schematically illustrated in FIG. 8, the parallel testing module 60 is realized from an appropriate portion 80A of a wafer 80 whereon the redirecting dice 40 are realized.

Obviously, the distribution process of the redirecting dice 40 should be realized so as to leave the distances D1 and D2 between adjacent dice according to the transverse and longitudinal development directions, i.e. to set first passages 62 and second passages 63 between the redirecting dice 40 which are substantially arranged as a matrix on the substrate 61, as explained with reference to FIG. 6, that substrate 61 corresponding to the substrate of the wafer 80.

Furthermore, it is underlined that the first slots 62A and the second slots 63A can be realized in the passages 62, 63 through a laser process performed on that substrate 61.

The invention also relates to a testing head 31 of the type comprising a plurality of contact probes 34, as well as an interface board 50 interposed between the upper guide 32 and a board 36 of a test equipment.

In particular, each contact probe 34 is equipped with a contact tip suitable to abut against contact pads of a device 35 to be tested and with a contact head suitable to perform the connection with a board 36 of the test equipment. In that case, the testing head 31 comprises at least one upper plate or guide 32 and one lower plate or guide 33, having respective holes in which the contact probes 34 slide.

In alternative, each contact probe 34 is removably constrained to a support, for example a ceramic one, and comprises a contact tip suitable to abut against contact pads of a device 35 to be tested and a contact element realized on such a ceramic support suitable to perform the connection with a board 36 of the test equipment. In particular, the contact probes 34 can be welded to the ceramic support, equipped in turn with contact bumps for the board 36.

According to an aspect of the invention, the interface board 50 comprises a redirecting die 40 whereon the contact elements of the contact probes 34 abut and equipped with a plurality of contact pins 53 for the board 36, as above described.

In the case in which the interface board 50 comprises a parallel testing module 60, including in turn a plurality of redirecting dice 40 as illustrated in FIGS. 6 and 7, the so-obtained testing head is able to test in parallel a plurality of devices, in particular in the same number as the number of redirecting dice 40 included in the parallel testing module 60, such a high testing parallelism not involving any complication for the wire bonding process to be used to finalize the interface board 50.

The present invention also relates to a method for realizing the interface board 50 of the testing head 31 comprising the redirecting die 40.

The method essentially comprises the steps of:
providing a substrate 51 for the interface board 50 realized with the printed circuit techniques;
integrating a redirecting die 40 on a semiconductor substrate 41 using the integration techniques of the integrated circuits;
housing the redirecting die 40 on a first surface of the substrate 51; and
electrically connecting a plurality of contact pads of the redirecting die 40 with a plurality of contact pins 53 projecting from a second surface of the substrate 51 opposed to the first surface whereon the redirecting die 40 is housed.

As already explained, the contact pins 53 are suitable to contact corresponding contact pads of a board 36 for realizing the desired connection with the test equipment.

More particularly, the step of integrating the redirecting die 40 on the semiconductor substrate 41 comprises the steps of:
realizing a first plurality of contact pads 42A distributed in a first central portion 42 of the redirecting die 40;
realizing a second plurality of contact pads 43A distributed in a second peripheral portion 43 of the redirecting die 40, the second peripheral portion 43 having a ring-like shape around the first central portion 42; and
realizing a plurality of metallic interconnection tracks 44, suitable to connect the contact pads 42A of the first central portion 42 with the contact pads 43A of the second peripheral portion 43 of the redirecting die 40.

In particular, the step of realizing the first plurality of contact pads 42A distributed in the first central portion 42 of the redirecting die 40 comprises a step of positioning these contact pads 42A in a spatial way corresponding to a plurality of contact pads realized on the device 35 to be tested.

According to an aspect of the invention, the step of integrating the redirecting die 40 on the semiconductor substrate 41 comprises the steps of back end masking used in the integration techniques of the integrated circuits for realizing the contacts.

More particularly, the steps of back end masking use the masks of the metallizations, contacts and vias and of the passivation.

Furthermore, the method comprises the steps of:
realizing a plurality of metallic pads 52 on the substrate 51 of the interface board 50, in electrical connection with the contact pins 53; and
connecting the metallic pads 52 to the contact pads 43A of the second peripheral portion 43 of the redirecting die 40 by means of bonding wires 54.

In alternative, the method comprises a step of connecting the contact pads 43A of the second peripheral portion 43 of the redirecting die 40 to the contact pads of the board 36 of the test equipment, in particular by means of bonding wires.

The method also comprises a step of positioning the redirecting die 40 in a centered way in comparison with the substrate 51 of the interface board 50 before performing the housing of the same on the first surface of the substrate 51 itself.

Moreover, the step of housing the redirecting die 40 on the first surface of the substrate 51 of the interface board 50 comprises a step between the following:
gluing the redirecting die 40 on the first surface of the substrate 51; and
welding the redirecting die 40 on the first surface of the substrate 51.

Moreover, this step of housing the redirecting die 40 on the first surface of the substrate 51 can preventively comprise a step of associating the redirecting die 40 to an intermediate base.

In alternative, the method comprises a step of realizing connections of the TSV type in the redirecting die 40 so as to contact the two surfaces thereof, these connections of the TSV type being realized in correspondence with the contact pads 43A of the second peripheral portion 43 of the redirecting die 40.

Furthermore, the step of integrating the redirecting die 40 on the semiconductor substrate 41 may comprise a step of encapsulating the redirecting die 40 itself in a package of the PGA type, being appropriately free of lid.

Finally, the method may also comprise a step of integrating additional electrical components and/or a testing logic portion in the semiconductor substrate 41 of the redirecting die 40.

It is immediate to verify as the proposed solution allows to overcome the limits still affecting the known technologies.

In particular, by realizing the redirecting die 40 with the technology of the integrated circuits, it is possible to realize the first plurality of contact pads 42A of the first central portion 42 with a pitch being similar to that of the pads of the device 35 to be tested. Moreover, it is possible to "loosen" the distance constraints between the pads of the second plurality of contact pads 43A distributed in the second peripheral portion 43 along the edges of the redirecting die 40, solving the problems tied to the packing of the probes and realizing the desired connection with the board 36 thanks to the contact pins 53, whose spatial distribution is independent from the spatial distribution of the pads of the device 35 to be tested.

Finally, by using a parallel testing module 60 comprising a plurality of redirecting dice 40, it is possible to realize interface boards and then testing heads with a high testing parallelism, without the complications of the process used to realize them.

Obviously, in order to meet contingent and specific requirements, a skilled person in the art could bring several changes and variations to the above described interface board and to the testing head, all included within the scope of protection of the invention as defined by the following claims.

The invention claimed is:

1. An interface board of a testing head for a test equipment of electronic devices, the testing head comprising a plurality of contact probes, each contact probe having a contact tip and a contact element, the contact tip being suitable to abut against contact pads of a device to be tested, the contact element being suitable to connect with a board of the test equipment, wherein the interface board comprises:
a substrate;
a redirecting die housed on a first surface of the substrate;
a plurality of contact pins projecting from a second surface of the substrate opposite to the first surface and suitable to contact the board, the redirecting die comprising a semiconductor substrate whereon a first plurality of contact pads is realized, suitable to contact a contact element of a contact probe of the testing head, wherein
the contact pads of the first plurality are distributed in a central portion of the redirecting die with a spatial distribution substantially corresponding to a spatial distribution of a plurality of contact pads of the device to be tested; and
a second plurality of contact pads distributed in a peripheral portion of the redirecting die and connected to the contact pads of the first plurality by a plurality of metallic interconnection tracks realized in the substrate of the redirecting die, the peripheral portion surrounding the central portion.

2. The interface board of claim 1, further comprising a plurality of metallic pads, which are realized on a peripheral portion of the substrate of the interface board, being left free by the redirecting die, and connected to the contact pins.

3. The interface board of claim 2, comprising:
a second plurality of contact pads distributed in a peripheral portion of the redirecting die and connected to the contact pads of the first plurality by a plurality of metallic interconnection tracks realized in the substrate of the redirecting die, the peripheral portion of the redirecting die surrounding the central portion; and
a plurality of bonding wires suitable to connect the metallic pads with the contact pads of the second plurality.

4. The interface board of claim 1, wherein the redirecting die comprises a pin grid array package without a lid.

5. The interface board of claim 1, wherein the redirecting die comprises bonding wire connections for a direct connection between the second plurality of contact pads and contact pads arranged in the board of the test equipment.

6. The interface board of claim 1, wherein the redirecting die comprises through-silicon via connections between the first and second surfaces thereof in correspondence with the contact pads of the second plurality.

7. An interface board of a testing head for a test equipment of electronic devices, the testing head comprising a plurality of contact probes, each contact probe having a contact tip and a contact element, the contact tip being suitable to abut against contact pads of a device to be tested, the contact element being suitable to connect with a board of the test equipment, wherein the interface board comprises:
a substrate;
a parallel testing module housed on a first surface of the substrate; and
a plurality of contact pins projecting from a second surface of the substrate opposite to the first surface and suitable to contact the board, the parallel testing module including in turn:
a substrate; and
a plurality of redirecting dice arranged as a matrix and suitably spaced from each other by separation passages, each redirecting die comprising a semiconductor substrate whereon at least a first plurality of contact pads is realized, suitable to contact a contact element of a contact probe of the testing head, wherein, for each redirecting die:
the contact pads of the first plurality of the redirecting die are distributed in a central portion of the redirecting die with a spatial distribution substantially corresponding to a spatial distribution of a plurality of contact pads of the device to be tested; and
a second plurality of contact pads is distributed in a peripheral portion of the redirecting die and connected to the contact pads of the first plurality of the redirecting die by a plurality of metallic interconnection tracks realized in the redirecting die, the peripheral portion surrounding the central portion.

8. The interface board of claim 7, wherein the parallel testing module comprises a plurality of slots realized in the separation passages and suitable to cross the substrate of the parallel testing module so as to house bonding wires for the connection with metallic pads which are realized on the substrate of the interface board in correspondence with the slots.

9. A testing head for a test equipment of electronic devices comprising a plurality of contact probes, each contact probe having a contact tip and a contact element, the contact tip being suitable to abut against contact pads of a device to be tested, the contact element being suitable to connect with a board of the test equipment, the testing head comprising at least one interface board including in turn:
a substrate;
a redirecting die housed on a first surface of the substrate; and
a plurality of contact pins projecting from a second surface of the substrate opposite to the first surface and suitable to contact the board, the redirecting die comprising a semiconductor substrate whereon a first plurality of contact pads is realized, suitable to contact a contact element of a contact probe of the testing head, wherein:
the contact pads of the first plurality are distributed in a central portion of the redirecting die with a spatial distribution substantially corresponding to a spatial distribution of a plurality of contact pads of the device to be tested; and
the interface board further comprises a second plurality of contact pads distributed in a peripheral portion of the redirecting die and connected to the contact pads of the first plurality by a plurality of metallic interconnection tracks realized in the substrate of the redirecting die, the peripheral portion surrounding the central portion.

10. The testing head of claim 9, wherein the interface board further comprises a plurality of metallic pads, which are realized on a peripheral portion of the substrate of the interface board, being left free by the redirecting die, and connected to the contact pins.

11. The testing head of claim 10, wherein the interface board comprises:
a second plurality of contact pads distributed in a peripheral portion of the redirecting die and connected to the contact pads of the first plurality by a plurality of metallic interconnection tracks realized in the substrate of the redirecting die, the peripheral portion surrounding the central portion; and
a plurality of bonding wires suitable to connect the metallic pads with the contact pads of the second plurality.

12. The testing head of claim 9, wherein the redirecting die comprises a pin grid array package without a lid.

13. The testing head of claim 9, wherein the redirecting die comprises bonding wire connections for a direct connection between the second plurality of contact pads and contact pads arranged in the board of the test equipment.

14. The testing head of claim 11, wherein the redirecting die comprises through-silicon via connections between the first and second surfaces thereof in correspondence with the contact pads of the second plurality.

15. A testing head for a test equipment of electronic devices comprising a plurality of contact probes, each contact probe having a contact tip and a contact element, the contact tip being suitable to abut against contact pads of a device to be tested, the contact element being suitable to connect with a board of the test equipment, the testing head comprising an interface board including in turn:
a substrate;
a parallel testing module housed on a first surface of the substrate; and
a plurality of contact pins projecting from a second surface of the substrate opposite to the first surface and suitable to contact the board, the parallel testing module including in turn:
a substrate; and
a plurality of redirecting dice arranged as a matrix and suitably spaced from each other by separation passages, each redirecting die comprising a semiconductor substrate whereon
a first plurality of contact pads is realized, suitable to contact a contact element of a contact probe of the testing head, wherein, for each redirecting die:
the contact pads of the first plurality of the redirecting die are distributed in a central portion of the redirecting die with a spatial distribution substantially corresponding to a spatial distribution of a plurality of contact pads of the device to be tested; and
a second plurality of contact pads is distributed in a peripheral portion of the redirecting die and connected to the contact pads of the first plurality of the redirecting die by a plurality of metallic interconnection tracks realized in the redirecting die, the peripheral portion surrounding the central portion.

16. The testing head of claim 15, wherein the parallel testing module comprises a plurality of slots, which are realized in the separation passages and suitable to cross the substrate of the parallel testing module so as to house bonding wires for the connection with metallic pads realized on the substrate of the interface board in correspondence with the slots.

* * * * *

UNITED STATES PATENT AND TRADEMARK OFFICE
CERTIFICATE OF CORRECTION

PATENT NO.        : 9,069,015 B2
APPLICATION NO.   : 13/548004
DATED             : June 30, 2015
INVENTOR(S)       : Giovanni Campardo et al.

It is certified that error appears in the above-identified patent and that said Letters Patent is hereby corrected as shown below:

In the claims

Column 16, Line 12, Claim 14:
"14. The testing head of claim 11, wherein the redirecting" should read, --14. The testing head of claim 9, wherein the redirecting--.

Signed and Sealed this
Ninth Day of February, 2016

Michelle K. Lee
*Director of the United States Patent and Trademark Office*